(12) United States Patent
Taber et al.

(10) Patent No.: US 7,777,583 B2
(45) Date of Patent: Aug. 17, 2010

(54) MODE SELECTIVE COUPLER FOR WHISPERING-GALLERY DIELECTRIC RESONATOR

(75) Inventors: Robert C. Taber, Palo Alto, CA (US); Curt Alan Flory, Los Altos, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 71 days.

(21) Appl. No.: 12/126,296

(22) Filed: May 23, 2008

(65) Prior Publication Data

US 2009/0289729 A1 Nov. 26, 2009

(51) Int. Cl.
*H03B 5/30* (2006.01)
*H01P 7/10* (2006.01)
(52) U.S. Cl. .................. 331/96; 331/107 DP; 333/219.1
(58) Field of Classification Search .................. 331/86, 331/96, 97, 107 DP; 333/125, 136, 137, 333/219.1, 227, 228, 230
See application file for complete search history.

(56) References Cited

U.S. PATENT DOCUMENTS

| | | | | | |
|---|---|---|---|---|---|
| 2,408,409 | A | * | 10/1946 | Bowen | 315/5.14 |
| 2,421,635 | A | * | 6/1947 | Mcarthur | 331/97 |
| 4,540,955 | A | * | 9/1985 | Fiedziuszko | 331/107 DP |
| 5,652,556 | A | * | 7/1997 | Flory et al. | 333/219.1 |
| 5,714,920 | A | * | 2/1998 | Ivanov et al. | 333/219.1 |
| 7,043,115 | B2 | * | 5/2006 | Frick | 385/27 |
| 7,463,121 | B2 | * | 12/2008 | D'Ostilio | 333/223 |
| 2008/0285617 | A1 | * | 11/2008 | Moldover et al. | 374/117 |

* cited by examiner

*Primary Examiner*—Robert Pascal
*Assistant Examiner*—Levi Gannon

(57) ABSTRACT

A whispering gallery mode dielectric resonator includes a conductive enclosure comprising a top, a bottom and walls. The resonator also includes a dielectric element disposed in the enclosure and operative to support a desired resonant mode that is dependent on a shape and dimensions of the dielectric resonator; and a mode selective coupling structure disposed over the enclosure and configured to selectively couple electromagnetic energy of the desired mode and configured not to substantially couple electromagnetic energy of a spurious mode supported in a region between the enclosure and the dielectric element.

18 Claims, 7 Drawing Sheets

MODE SELECTIVE COUPLER FOR WHISPERING-GALLERY DIELECTRIC RESONATOR

BACKGROUND

Many microwave circuits depend on a reference oscillator constructed from an amplifier and a high Q resonator. There has been a long felt need for simple resonators with extremely high Q values. Higher Q value resonators provide a comparatively low phase-noise signal source, which is useful in a wide variety of applications in very disparate technical fields.

Simple metal cavities were the original prototype microwave resonators. The performance of these devices, however, is limited by the resistive losses in the enclosure walls. These losses result from currents generated in the walls by the electromagnetic fields in the cavity.

To reduce such losses, a low loss dielectric material is placed in the cavity. The material partially confines the electromagnetic fields within the dielectric, and thus decreases the relative strength of the fields and shielding currents at the enclosure walls. This resonator configuration is often referred to as a "loaded cavity" configuration. The performance limitations of loaded cavity resonators are governed by a combination of the loss tangent of the dielectric material, and the (reduced) currents in the enclosure walls.

The dielectric with the lowest known loss tangent at microwave frequencies is monocrystalline sapphire. Furthermore, the loss tangent of this material decreases with temperature, being proportional to $T^{-5}$. As a result, it is the material of choice for many high performance applications of dielectric resonators, particularly at cryogenic temperatures.

Unfortunately, sapphire dielectric resonators have a relatively low dielectric constant ($\epsilon_r=10$). As a result, the strength of the electromagnetic field external to the dielectric itself is still relatively high compared to materials with significantly higher dielectric constants. Thus, specialized design strategies are needed to reduce the losses due to the contributions from the electrical currents on the inside surfaces of the enclosure walls.

One type of sapphire dielectric resonator is the so-called "whispering gallery" resonator. A whispering gallery resonator includes a sapphire ring or disk, which confines the electromagnetic energy to the dielectric region by a physical mechanism not unlike total internal reflection in optical systems. The modes can be qualitatively described as traveling waves around a bent dielectric waveguide that closes upon itself. This configuration provides strong electromagnetic energy confinement due to the existence of only evanescent fields outside of the dielectric structure. The relative field confinement increases rapidly as a function of mode number. Here, mode number is defined as the index of the azimuthal variation of electromagnetic field of the mode. It is one half of the number nodes encountered in one complete circuit of the ring. Nodes are field minima that mark the boundaries of regions with opposing field orientation. The regions of maximum field magnitude are known as anti-nodes. For mode numbers on the order of four (4) or more, the relative field energy confinement is sufficient to significantly reduce the Q degradation from enclosure wall loss relative to the first type of resonator described above. Configurations of this type allow Q values approaching the limitations imposed by the internal sapphire loss mechanisms, as well as greatly reduced vibrational sensitivity.

Unfortunately, at microwave frequencies, the mode density in the frequency domain is extremely high. As a result, the desired resonant mode is typically very close in frequency to other, spurious, modes. These spurious modes consist of other modes supported by the sapphire ring (the whispering gallery modes) as well as "hybrid" modes, which are simply the usual empty cavity modes perturbed by the presence of the sapphire ring. With the need for low-phase noise signal source, these spurious modes must be prevented from coupling out of the resonator.

One way to preclude spurious modes from deteriorating the output of the resonator is through the use of a filter. While filtering the spurious modes can be useful, the insertion loss is often unacceptably high. Ultimately, the power loss can be too great, especially when the bandwidth of the filter must be kept comparatively low to ensure proper mode selection and filtering.

There is a need, therefore, for a whispering gallery mode resonator and electrical oscillator that overcome at least the shortcoming of known resonators and oscillators described above.

SUMMARY

In accordance with a representative embodiment, a whispering gallery mode dielectric resonator, comprising: a conductive enclosure comprising a top, a bottom and walls. The resonator also includes a dielectric element disposed in the enclosure and operative to support a desired resonant mode that is dependent on a shape and dimensions of the dielectric resonator; and a mode selective coupling structure disposed over the enclosure and configured to selectively couple electromagnetic energy of the desired mode and configured not to substantially couple electromagnetic energy of a spurious mode supported in a region between the enclosure and the dielectric element.

In accordance with another representative embodiment, an electrical oscillator circuit comprises a whispering gallery mode dielectric resonator, an amplifier and a bandpass filter. The whispering gallery mode dielectric resonator comprises: a conductive enclosure comprising a top, a bottom and walls. The resonator also includes a dielectric element disposed in the enclosure and operative to support a desired resonant mode that is dependent on a shape and dimensions of the dielectric resonator. In addition, the resonator includes a mode selective coupling structure disposed over the enclosure that is configured to selectively couple electromagnetic energy of the desired mode and configured not to substantially couple electromagnetic energy of a spurious mode supported in a region between the enclosure and the dielectric element. The bandpass filter is operative to filter spurious modes from the whispering gallery mode dielectric resonator.

BRIEF DESCRIPTION OF THE DRAWINGS

The present teachings are best understood from the following detailed description when read with the accompanying drawing figures. The features are not necessarily drawn to scale. Wherever practical, like reference numerals refer to like features.

DEFINED TERMINOLOGY

It is to be understood that the terminology used herein is for purposes of describing particular embodiments only, and is not intended to be limiting.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to its ordinary and customary meaning, the term 'substantially' means within acceptable limits or within acceptable tolerances.

DETAILED DESCRIPTION

In the following detailed description, for purposes of explanation and not limitation, representative embodiments disclosing specific details are set forth in order to provide a thorough understanding of the present teachings. Descriptions of known systems, devices, materials, methods of operation and methods of manufacture may be omitted so as to avoid obscuring the description of the example embodiments. Nonetheless, systems, devices, materials and methods that are within the purview of one of ordinary skill in the art may be used in accordance with the representative embodiments.

Figure 1:
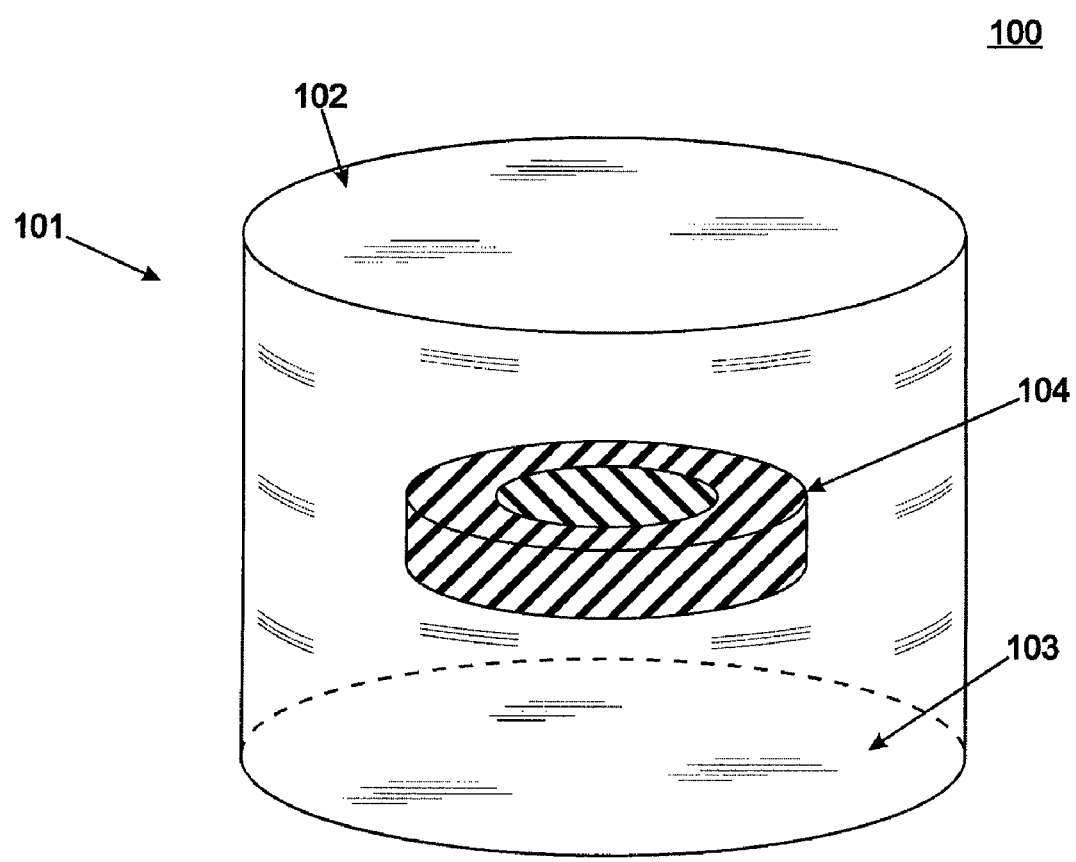
FIG. 1 is a perspective view of a whispering gallery mode resonator used in accordance with a representative embodiment.

FIG. 1 is a perspective view of a whispering gallery mode resonator 100 used in accordance with a representative embodiment. The resonator 100 includes an electrically conductive enclosure 101 having a top 102 and a bottom 103. The resonator 100 also includes a dielectric element 104, used for resonant mode propagation. The resonator 100 may be as described more completely in U.S. Pat. No. 5,652,556 entitled "Whispering Gallery-Type Dielectric Resonator with Increased Resonant Frequency Spacing, Improved Temperature Stability, and Reduced Microphony" to Curt A. Flory and Robert C. Taber. This patent, which is commonly assigned, is specifically incorporated herein by references.

The enclosure 101 of the representative embodiment may be metal or other suitable conductor useful in providing shielding and mode containment of the resonator 100. The dielectric element 104 may be sapphire or other similar material. In the representative embodiments herein, the enclosure 101 is substantially cylindrical; the dielectric element is in the shape of a ring and is centrally located within the enclosure 101. The element 104 is suspended in position by one or more supports (not shown) such as described in the patent to Flory, et al.

In designing high-Q resonators it is advantageous to use dielectric materials that exhibit the lowest intrinsic material losses at the operational frequency. For microwave resonators, high purity sapphire is often the material of choice. However, a fundamental constraint on the design of high Q sapphire dielectric resonators is imposed by the low value of the dielectric constant of sapphire ($\in_r \approx 10$).

With such a comparatively low dielectric constant, the strength of the electromagnetic field external to the dielectric element 104 will be comparatively high. As such, it will generally be beneficial to adopt specialized design strategies in order to avoid excessive loss contributions from the shielding currents on the inside surfaces of the enclosure 101. In operation, the dielectric element 104 confines the electromagnetic energy to the dielectric region. The modes can be qualitatively described as traveling waves around a bent dielectric waveguide which closes upon itself. The comparatively strong electromagnetic energy confinement is due to the existence of only evanescent fields outside of the dielectric element 104, and in the region between the element 104 and the enclosure 101. The relative mode confinement increases rapidly as a function of the mode number, where mode number is defined as the number of modal maxima encountered in one complete circuit of the ring.

Figure 2:
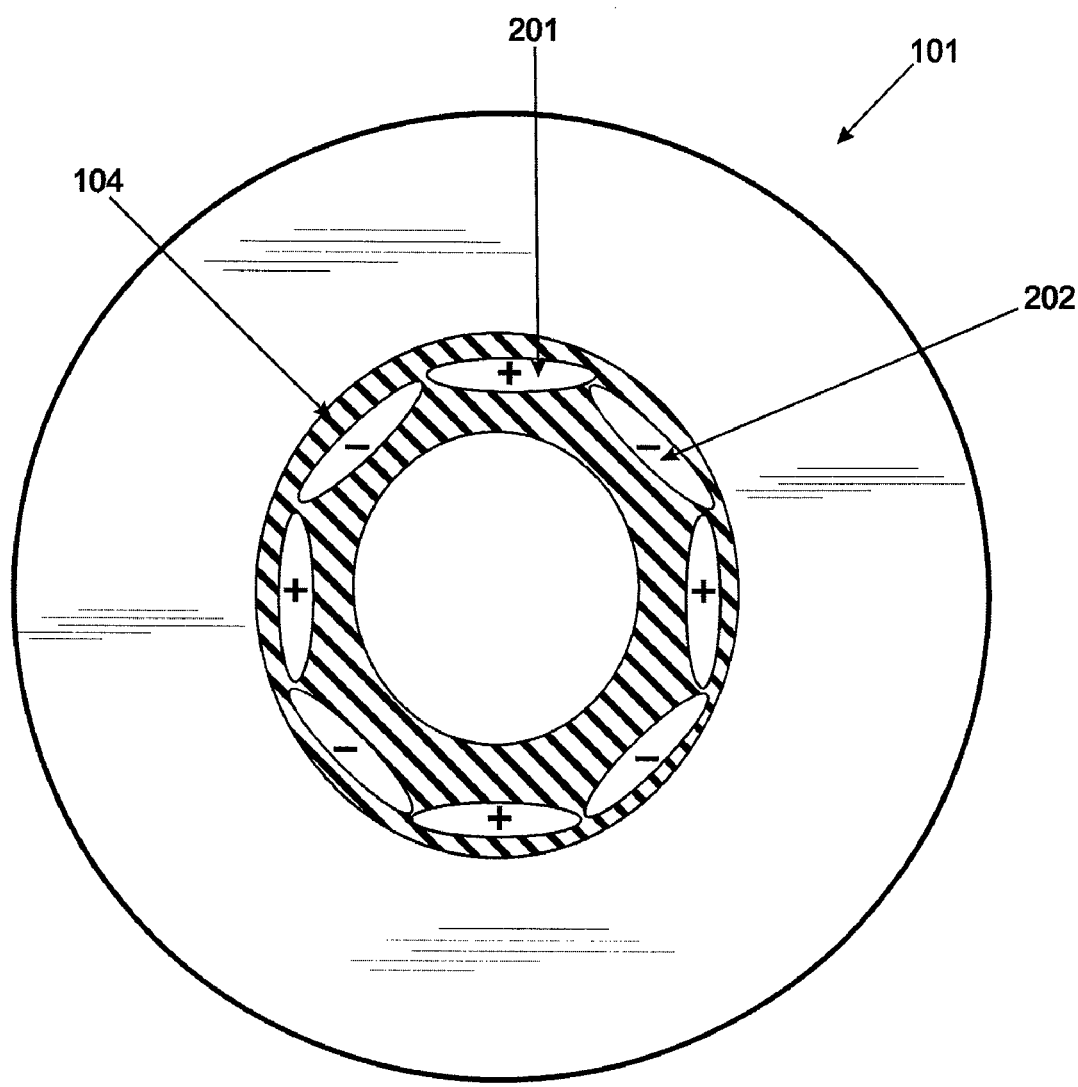
FIG. 2 is a top view showing anti-nodes of a desired mode of a whispering gallery mode resonator in accordance with a representative embodiment.

FIG. 2 is a top view of the resonator 100 conceptually showing anti-nodes of a desired mode (modal field amplitudes) of a whispering gallery mode resonator 100. The anti-nodes 201 and 202 of the mode are distributed spatially around the element 104. The mode depicted in FIG. 2 has a mode index of four. The oscillatory nature of the fields is represented by the alternating sign of the field amplitude. As shown in FIG. 2, the anti-nodes 201 have a relative phase of 180° ($\pi$ radians) to anti-nodes 202. As such, adjacent anti-nodes 201 and 202 have vector (e.g., E field vector) orientations that are opposite to one another. As will become clearer as the present description continues, coupling loops (inductive couplers) or stub antennae (electrical connections) are connected to transmission lines and ultimately selectively to one another to garner signals from the anti-nodes 201, 202 to provide the oscillator signal.

For mode numbers on the order of four or more, the relative field energy confinement is strong enough to greatly minimize the Q degradation from enclosure wall loss. Configurations of this type allow Q values approaching the limitations imposed by the internal sapphire loss mechanisms. However, a significant difficulty with whispering gallery resonators is that in the microwave regime, the required size is such that the mode density in the frequency domain is extremely high. As a result, two types of undesired modes can result. First, there are spurious modes supported by the dielectric element 104. These spurious modes can be spaced comparatively close in frequency to a desired resonant mode, but will have different values of the azimuthal mode index when compared to the desired mode. Thus, they will have azimuthal symmetry that differs from that of the desired mode. If coupled out of the resonator 100, these spurious modes reduce the purity of the oscillatory signal from the resonator 100 and as a result degrade the performance.

Furthermore, "hybrid" modes exist. Hybrid modes are modes that are supported in the cavity between the dielectric element 104 and the enclosure 101 and are perturbed by the presence of the sapphire ring. Like the spurious modes, hybrid modes can degrade device performance if coupled from the resonator. Usefully, neither of these types of modes should be coupled out of the resonator 100. As referenced previously, known methods of mitigating undesired modes can increase insertion loss and degrade oscillator performance. Beneficially, the whispering gallery mode resonators of the present teachings avoid such degradation by reducing the coupling of these modes out of the resonator 100.

Figure 3:
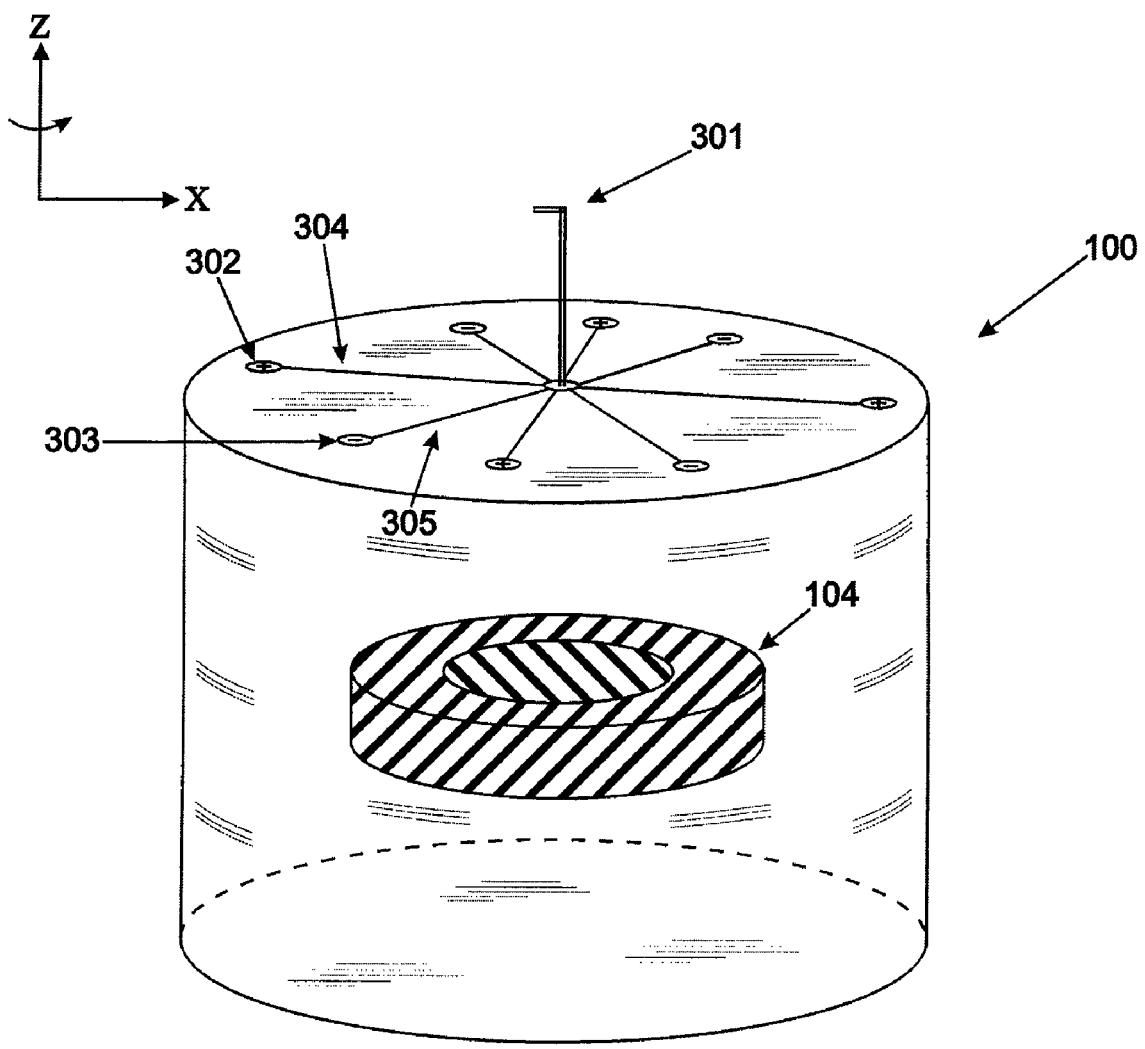
FIG. 3 is a perspective view of a whispering gallery mode resonator in accordance with a representative embodiment.

FIG. 3 is a perspective view of a whispering gallery mode resonator 100 in accordance with a representative embodiment. The resonator includes a coupling port 301 operative to transmit a desired resonant mode from the resonator 100. A first coupling element 302 is provided over an anti-node (e.g., anit-node 201) of the desired resonant mode of the dielectric element 104. A second coupling element 303 is provided over an opposing anti-node (e.g., anti-node 202) of the desired resonant mode of the dielectric element 104. As will be appreciated, and as discussed more fully herein, there are first and second coupling elements 302,303 for each respective anti-node of the desired mode selectively located over the spatial position of the anti-nodes.

The resonator 100 shown in FIG. 3 is a single port resonator. An amplifier (not shown) may feed its output to the coupling port 301 and receive the reflection from the dielectric element 104 as fed through the coupling elements 302, 303 to the coupling port 301 and back to the amplifier. In other embodiments described herein another port and additional coupling elements are provided for resonant mode excitation in the dielectric element 104 and resonator 100.

Notably, the desired mode coupled to the coupling elements 302, 303 and ultimately to the coupling port 301 via respective transmission lines 304,305, respectively, comprises an evanescent mode of the dielectric element 104. To this end, in satisfaction of boundary conditions, an evanescent wave of the desired mode emanates from the dielectric element and is spatially located commensurate with the confined portion of the desired mode. The coupling elements 302, 303 are thus placed to couple to the evanescent mode as described more fully herein. Beneficially, the mode selective coupling scheme of the present teachings is operative to provide a comparatively low insertion loss for the desired whispering gallery mode, and a comparatively high insertion loss for all other (spurious and hybrid) modes.

The coupling elements 302,303 take advantage of the modal symmetries of the cylindrically symmetric resonator. It is well known that all of the electromagnetic modes of a cylindrically symmetric structure have an azimuthal angular dependence given by sin (m$\phi$)) or cos (m$\phi$), where $\phi$ is the rotation angle about the axis of symmetry (z-axis of FIG. 3) and m is the order of the azimuthal symmetry.

For the whispering gallery modes, as shown schematically in FIG. 3, this integer m is the previously described mode number. The mode selective coupling structure comprising coupling elements 302, 303 is designed to coherently couple to the desired mode at a number of symmetrical field points, and sum these contributions together to generate the net interaction. The connection to assure coherent coupling is described more fully in connection herein.

The coupling elements 302, 303 of the mode selective coupling structure in accordance with a representative embodiment shown in FIG. 3 couples to the m=4 whispering gallery mode. The mode selective coupling structure consists of eight coupling elements 302, 303 that are equally spaced in angle about the axis of symmetry, and of equal size and radial position. The loops are all connected by substantially equal lengths of transmission line 305 to a summation point, where adjacent coupling elements 302, 303 are summed 180° out of phase. As described more fully herein, this phase reversal can either be implemented by oppositely orienting adjacent loops, or by sequentially reversing the transmission line leads at the summation point.

The mode-selective behavior of the coupling elements 302, 303 may be described mathematically. As described presently, due to the generality of the symmetry considerations, the coupling occurs substantially exclusively to modes of the desired order. Consider a coupling structure that consists of 2 m coupling element 302,303 equally spaced in angle with $\Delta\phi=2\pi/2$ m all at the same radial distance R from the axis of symmetry. The coupling signal of this structure from a mode of order p has the form (eqn. 1):

$$V_{sig}^{(p)} = \sum_{n=1}^{2m} (-1)^n e^{ik_\phi^{(p)} x_n} V_0$$

where $k_\phi^{(p)}$ is the azimuthal propagation vector of the $p^{th}$ order mode and is expressed as (eqn. 2):

$$k_\phi^{(p)} = \frac{2\pi}{\lambda^{(p)}} = \frac{2\pi}{(2\pi R/p)}$$

The azimuthal positions, $x_n$, of the coupling elements 302, 303 for the mode are given by (eqn. 3):

$$x_n = \frac{2\pi R}{2m} n$$

Finally, $V_o$ is the signal (voltage) coupled to each coupling element 302,303 and is presumed to be of equal magnitude at each element 302, 303. Substituting the terms from eqns. 1 and 2 into eqn. 3 yields (eqn. 4):

$$V_{sig}^{(p)} = V_0 \sum_{n=1}^{2m} (-1)^n e^{i\pi \frac{p}{m} n} = V_0 \sum_{n=1}^{2m} (-e^{i\pi p/m})^n$$

Eqn. 4 simplifies to (eqn. 5):

$$V_{sig}^{(p)} = -V_0 e^{i\pi p/m} \frac{(1-e^{2\pi i p})}{(1+e^{i\pi p/m})}.$$

The squared magnitude of the coupling signal for the pth mode is given by (eqn. 6):

$$|V_{sig}^{(p)}|^2 = V_0^2 \frac{1-\cos(2\pi p)}{1+\cos(\pi p/m)}$$

This provides the conditions of coupling for the coupling elements 302,303 placed at $x_n$ as shown in FIG. 3 (eqn. 7):

$$|V_{sig}^{(p)}|^2 = \begin{cases} (2m)^2 V_0^2 & \text{for } p=m \\ 0 & \text{for } p \neq m \end{cases}$$

Thus, the desired order-m coupling elements 302,303 couple only to the desired order-m electromagnetic modes due to symmetry considerations. It should also be noted that the order-m whispering gallery mode is the lowest frequency order m mode. The hybrid (or cavity) modes of order-m have their fields predominantly outside of the dielectric ring material, and as a result have resonant frequencies that are roughly a factor of $(\epsilon_r)^{1/2}$ higher than that of the whispering gallery mode, which has the bulk of its fields within the dielectric ring. As a result, even for a material of relatively low dielectric constant such as sapphire with $\epsilon_r \approx 10$, the remaining spurious modes that could couple to the coupling elements 302,303 have frequencies more than three times larger than the desired whispering gallery mode of the same order. These remaining spurious modes have frequencies well outside of the gain bandwidth of the microwave amplifier used in an oscillator circuit, and the mode selective coupler effectively couples exclusively to the desired order-m whispering gallery mode.

An additional benefit of the coupling structure of the representative embodiments is that the far-from-carrier feedthrough between the input and output couplers is dramatically reduced, eliminating one possible limitation to far-from-carrier noise floor performance.

Figure 4:
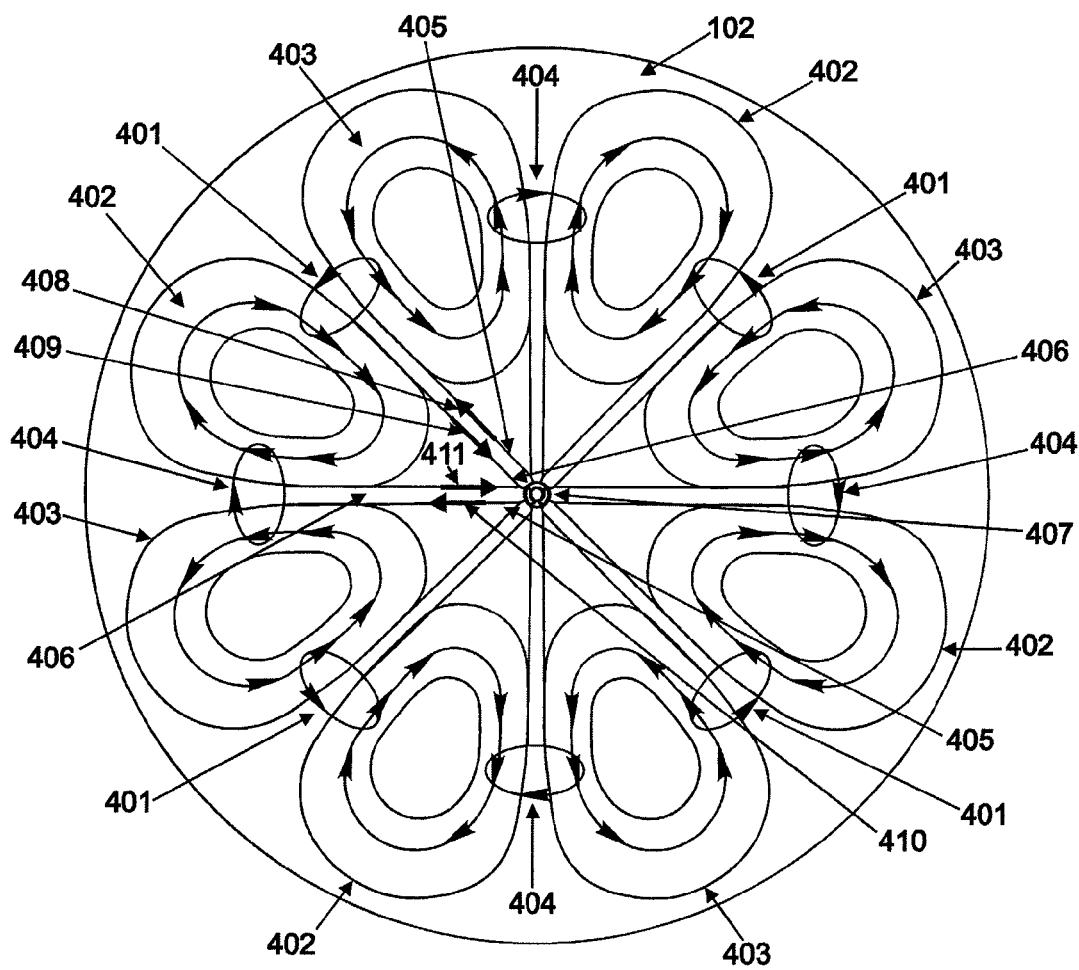
FIG. 4 is a top view showing magnetic field lines of a desired mode with magnetic flux through coupling elements in accordance with a representative embodiment.

The coupling of the desired mode to coupling elements 302, 303 can be an inductive coupling to the magnetic field of the mode, or a direct coupling to the electric field of the mode. FIG. 4 illustrates the inductive coupling method where the conductive elements are conductive loops that are illustratively substantially circular in cross-section. FIG. 4 is a top view somewhat like FIG. 2 and conceptually shows magnetic field lines of a desired mode with magnetic flux through coupling elements in accordance with a representative embodiment.

A first conductive loop 401 is disposed between time-varying magnetic field lines at the surface of the top 102 of the enclosure 101. First field lines 402 have a counter-clockwise rotation and second field lines 403 have a clockwise rotation. Thus, first and second field lines 402,403 induce current in one direction. A second conductive loop 404 is immersed so that first field lines 402 and second field lines 403 are oriented opposite those through first loop 401. As such, the direction of the induced current is opposite that of the current induced in the first loop 401, and thus, the currents in loops 401, 404 are counter-rotating. Similar analysis follows for all other conductive loops 401, 404 and as will be appreciated, the induced current for each loop is opposite to that of its adjacent or next-neighboring loops. The net result is that the induced current alternates from one loop to the next.

Each loop 401,404 is connected by a transmission line (e.g., a microstrip line) with each loop 401, 404 selectively connected to a first transmission line 405 and a second transmission line 406. The transmission lines 405,406 are connected at a coupling port 407 central to all loops 401,404. In an alternative embodiment, the coupling port 407 may be located at a side of the top 102.

The connection of the transmission lines 405,406 to respective first and second loops 401,404 are such that the polarities are switched between each loop and its neighbors. Thereby, each loop 401,404 contributes to the summation signal with the same polarity. For example, consider loop 401, which has a counter-clockwise current induced therein from the B-fields of first field lines 402 and second field lines 403. This induced current travels along first transmission line 405 in direction 408 and along second transmission line 406 direction 409. By contrast, consider loop 404, which is adjacent to (next nearest neighbor) to loop 401. In this case, the induced current travels in a clockwise manner as a result of the time-varying B-fields therein. This induced current travels along first transmission line 405 in direction 410 and second transmission line 406 direction 411. Similar analysis applies to all other loops 401, 404 and transmission lines 405, 406; and, as will be readily appreciated, in adjacent loops 401, 404, the currents induced in respective transmission lines 405 in directions 408 and 410 are aligned or in parallel; and the currents induced in respective transmission lines 406 in directions 409 and 411 are also aligned or in parallel, albeit oriented 1800 relative to the currents in transmission lines 405.

In a representative embodiment, all transmission lines 405 are connected electrically in parallel and thereby summed at coupling port 407; and all transmission lines 406 are connected electrically in parallel and thereby summed at coupling port 407. In this manner all antinodes are summed according to their respective relative vector orientation and phase. Notably, the location of the coupling port 407 in the center of the top 102 of the enclosure 101 allows the length of each transmission line 405, 406, which are on the order of one wavelength of the desired mode, to be the same. Beneficially, therefore, the path length of the signal to/from the coupling port 407 is the same for each portion of the mode selective coupling structure comprising the transmission lines 405, 406 and respective loops 401, 404. As noted, in certain embodiments, the coupling port 407 may be provided along a side of the top 102. As will be appreciated, care must be taken to ensure the path length from each loop 401, 404 is substantially the same. This can be achieved by a number of methods, such as by feeding the transmission lines 405, 406 into common lines (not shown) and then to port 407; or by including delay elements to ensure path length equality. Thereby, certain drawbacks associated with path length differences can be substantially avoided.

In the representative embodiments described, the like-polarity currents are connected together and in parallel. While this method avoids problems encountered with other connection possibilities, the present teachings contemplate other connections to garner the mode from the resonator 101. For example, the transmission lines may be connected in series, with each first transmission lines 405, 406 connected serially and ultimately to coupling port 407. This technique requires careful consideration of propagation velocity of the mode and attendant path delay to ensure efficient coupling of the mode.

As should be appreciated from the above description, the resonator 100 of the representative embodiments exploits the azimuthal symmetry of desired mode(s) of the dielectric element 104. Additionally, the resonator 100 of the representative embodiments benefits from the incommensurate symmetry of undesired modes. In particular, undesired modes that may couple to the individual loops 401,404 would not exhibit the same symmetry as the desired mode and the summation of their contributions would provide exact cancellation. As such, not only does the mode selective coupling structure provide a suitable transmission coefficient for the desired mode, but also provides a suitable discrimination against the undesired modes. Ultimately, these factors combine to improve the overall signal quality of the output desired mode compared to known resonators.

Figure 5:
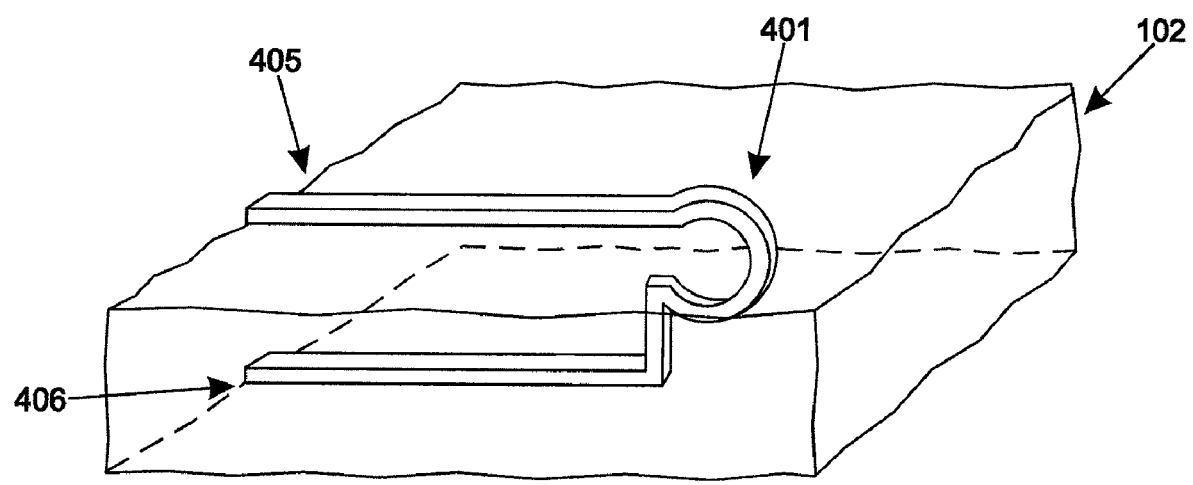
FIG. 5 is a perspective view of a coupling element in accordance with a representative embodiment.

As noted previously, coupling elements of the selected mode selective coupling structure may inductively couple to the desired mode; or may electrically couple to the mode. FIG. 5 illustrates coupling loop 401 with transmission lines 405 and 406 connected as shown in accordance with a representative embodiment. It is emphasized that the manner, shape and placement of the loop 401 and transmission lines 405, 406 shown in FIG. 5 are merely illustrative and other structures are contemplated to effect inductive coupling in keeping with the present teachings. Moreover, as will be appreciated, if connected to coupling loop 404, transmission lines 405,406 would be 'switched' or otherwise connected at the coupling port 407 so that the phase orientation of the summed induced currents would properly add. Notably, the top 102 of the enclosure may be a printed circuit board (e.g., FR4) or other similar structure providing both the dielectric and ground planes for the transmission lines 405,406, which may be provided as metal traces. Alternatively, microstripline transmission lines may be provided over a suitable dielectric substrate (e.g., alumina) for microwave signal transmission. The methods of fabrication and materials for such structures are known and not repeated to avoid obscuring the description of embodiments. It is emphasized that the method, materials and geometric configurations are merely illustrative and in no way limiting of the present teachings.

Figure 6:
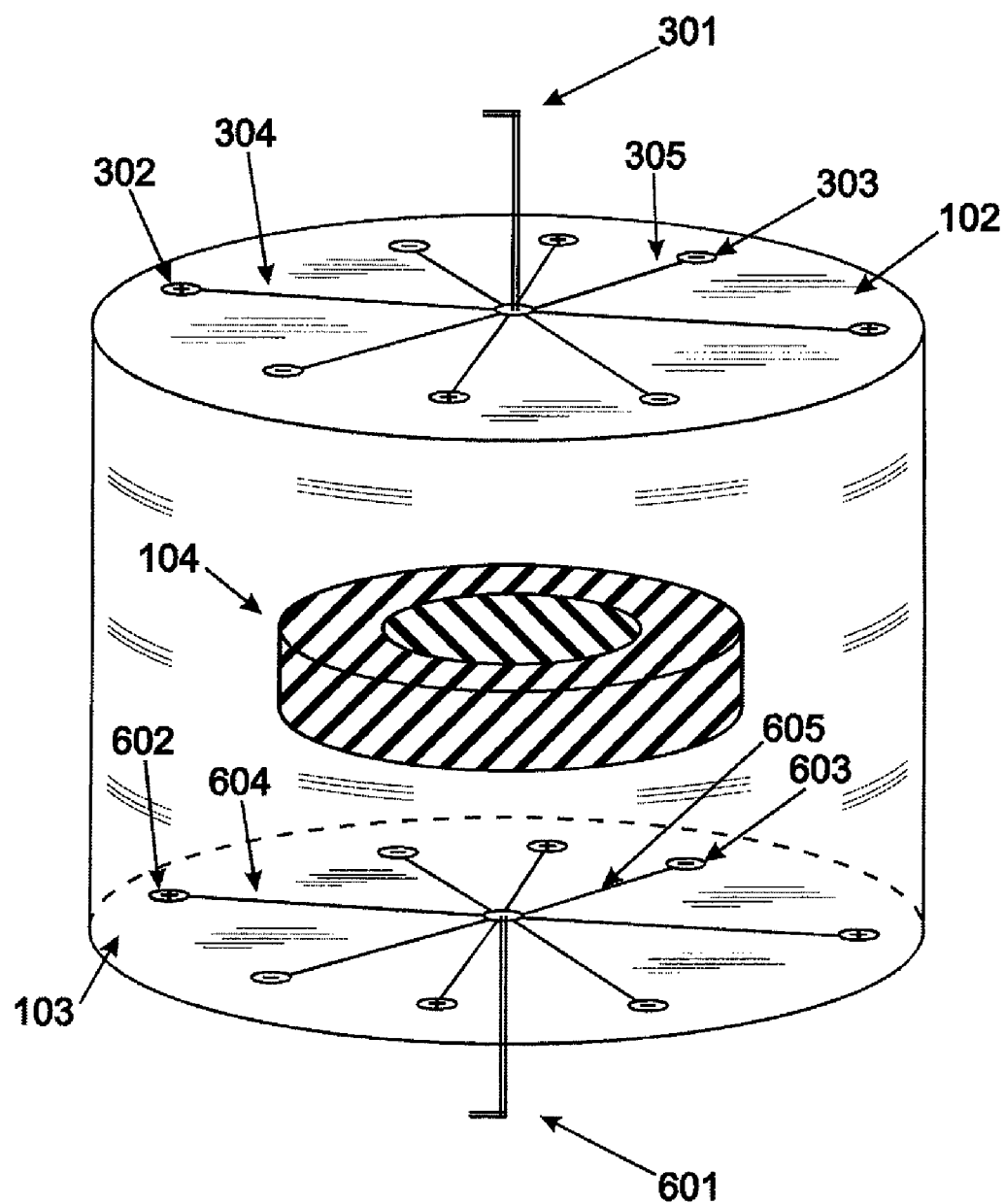
FIG. 6 is a perspective view of a whispering gallery mode resonator in accordance with a representative embodiment.

FIG. 6 is a perspective view of a whispering gallery mode resonator 100 in accordance with a representative embodiment. The resonator 100 shares many features in common with the resonators described previously. Such common features are not repeated in order to avoid obscuring the present embodiment.

The resonator 100 includes a mode selective coupling structure comprising first and second coupling elements connected to the coupling port 301 disposed over the top 102; and another mode selective coupling structure disposed over the bottom 103 of the enclosure 101. The mode selective coupling structure disposed over the bottom 103 of the enclosure 101 comprises third coupling elements 602 and fourth coupling elements 603 connected to a second coupling port 601 via transmission lined 604, 605 respectively. The coupling elements 602,603 are positioned respectively over to excite the desired anti-nodes of alternating orientation/phase of the desired whispering gallery mode. As should be appreciated, the spatial locating of the coupling elements 602,603 is effected in substantially the same manner as the spatial locating of coupling elements 302,303. Moreover, if used as coupling loops, the structure and materials described in connection with FIG. 5 may be used.

In a representative embodiment, the coupling ports 301, 601 may be output and input coupling ports, respectively, and the coupling elements 302,303,601,603 in combination with respective coupling ports form input and output mode selective couplers, respectively. Alternatively, only one of the coupling structures (input or output) can be designed to be mode selective, and the other coupling port can be of the single-loop (or single stub) variety previously described. In all of these embodiments, the external connection can be made in a variety of ways known to one skilled in the art such as described previously.

The resonator 100 of FIG. 6 is a two-port device. A portion of the output signal is coupled to an amplifier (not shown in FIG. 6) and provided through a feedback loop to the second (input) port 601. As should be appreciated, because of the structural symmetry of the resonator 100 shown in FIG. 6, the first port 301 could be the input port and the second port 601 could be the output port. Additional details of such a two-port device are discussed in connection with FIG. 7.

The representative embodiments described may be implemented in a variety of materials. As will be appreciated, the materials and the locating of the coupling elements are important to proper selective mode coupling. Presently, a description of materials and the location of coupling elements are described to further illustrate the representative embodiments described. The description is merely illustrative and it is emphasized that other structures, geometries and materials are contemplated. Thus, variations of the described embodiments within the purview of one skilled in the art having had the benefit of the present disclosure are contemplated.

In oscillator design, impedance of the resonator coupler as seen from the external port connection is an important consideration. To improve oscillator performance, the impedance of the coupling structure is designed to substantially match (within acceptable tolerance) the characteristic impedance of the external connecting transmission line. For a simple output loop structure coupling to a resonator mode, the output signal is generated by the voltage induced from the modal magnetic field threading the cross section of the coupling loop, as determined from Maxwell's equations. From this physical model relating the modal field strengths to induced signal voltages, a simple expression for the loop impedance ($R^{(1)}$) as seen from the external port can be derived (eqn. 8)

$$R^{(1)} = \frac{\omega |B_0|^2 A^2 Q_u}{2W_0}$$

where $\omega$ is the mode angular frequency, $B_o$ is the magnetic field strength of the mode at the center of the loop, $W_o$ is the total energy of the mode, $Q_u$ is the unloaded-Q factor of the mode, and A is the loop area. For the mode selective coupler described above with 2 m loops, it is easily shown following the calculations of eqns. 1-7 that the input impedance for the single loop is modified by a simple factor of $(2\,m)^2$ (eqn. 9):

$$R^{(m)} = (2m)^2 \frac{\omega |B_0|^2 A^2 Q_u}{2W_0}.$$

Thus, eqn. 9 is an expression for the impedance of a mode selective coupler of order-m. Modeling software can be used to calculate the properties of the resonant modes of a whispering gallery resonator structure. In a representative embodiment, having a sapphire ring for element 104 with an inner radius of 0.9 cm, an outer radius of 1.5 cm, and a height of 0.9 cm, symmetrically placed in a cylindrical metal enclosure of radius 2.25 cm and height 1.8 cm, the whispering gallery mode $WGH_{711}$ has a mode frequency of 10.8 GHz and a $Q_u$ of approximately 170,000. If the 14 coupling loops for the mode selective coupler are situated on the end cap of the enclosure at a distance of 1.35 cm from the center axis of symmetry of the enclosure (i.e. the axis along the z-direction through which the coupling ports 301, 601 pass), to obtain a coupler impedance of 50 ohms the individual loop areas must be approximately 0.7 mm². This impedance can be scaled to any desired value by adjusting the individual loop area according to eqn. 9.

Figure 7:
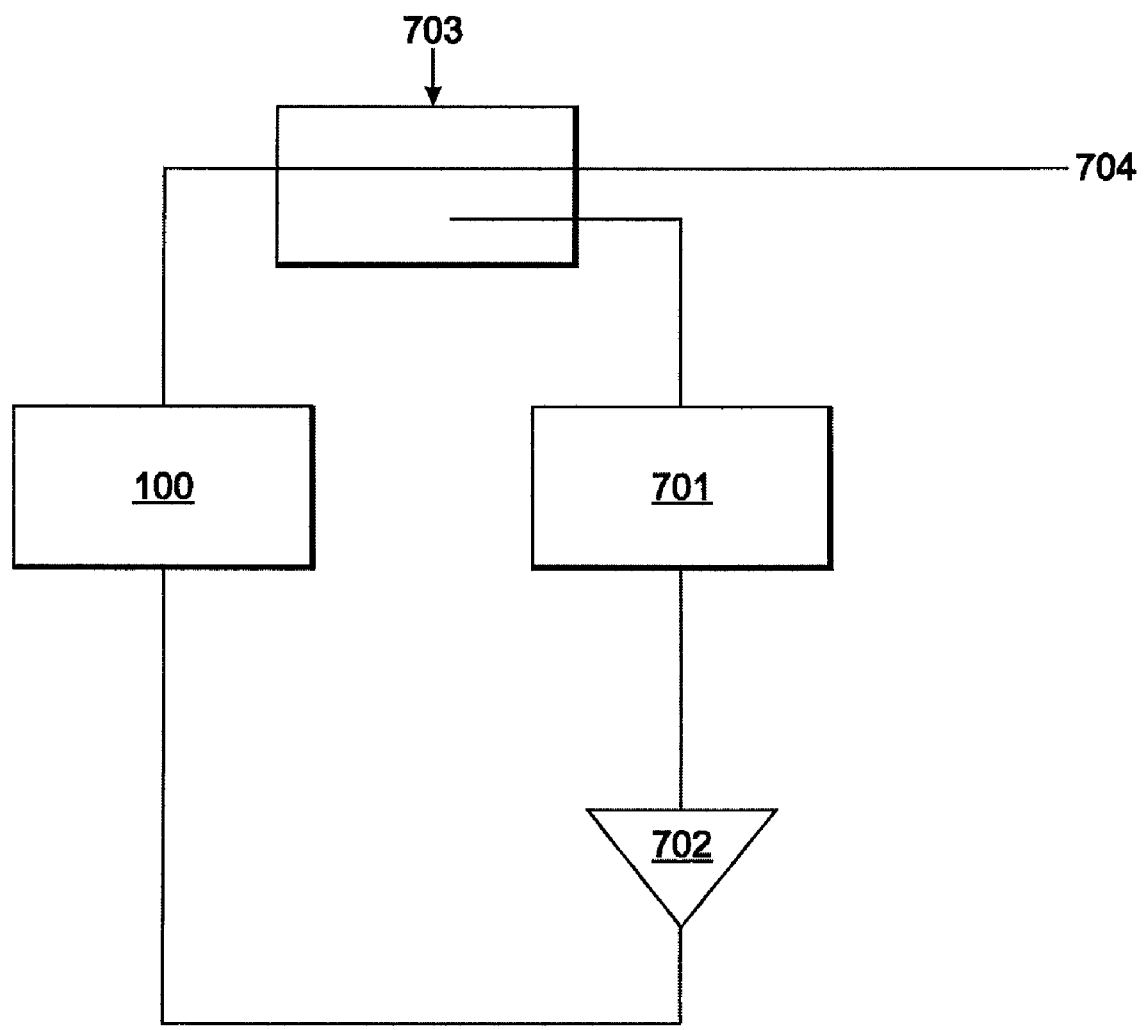
FIG. 7 is a simplified schematic circuit diagram of an oscillator circuit in accordance with a representative embodiment.

FIG. 7 is a simplified schematic circuit diagram of an oscillator circuit including a two-port resonator 100 (e.g., as shown in FIG. 6) in accordance with a representative embodiment. The oscillator circuit includes a bandpass filter 701 connected to an amplifier 702. The output of the amplifier 702 is connected to whispering gallery mode resonator 100 such as described in connection with FIG. 6. The resonator 100 provides a desired mode to the tap 703, which in turn provides an output 704. A portion of the signal from the resonator 100 is tapped in the loop as shown. The output signal provides a comparatively high fidelity oscillator signal with comparatively low phase noise, low insertion loss and thus comparatively high performance. The presence of coupling to spurious modes would have corrupted this signal, either by way of undesirable "spurs" in the phase noise spectrum, or as an elevated "floor" in the phase noise far from the carrier.

In view of this disclosure it is noted that variations to the high-Q whispering mode dielectric resonators, and oscillator circuits including the whispering mode dielectric resonators. Further, the various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A whispering gallery mode dielectric resonator, comprising:
   a conductive enclosure comprising a top, a bottom and walls;
   a dielectric element disposed in the enclosure and operative to support a desired resonant mode that is dependent on a shape and dimensions of the dielectric resonator; and
   a mode selective coupling structure disposed over the enclosure and configured to selectively couple electromagnetic energy of the desired mode and configured not to substantially couple electromagnetic energy of a spurious mode supported in a region between the enclosure and the dielectric element, wherein the mode selective coupling structure comprises: a first coupling element aligned with a first anti node of the resonant mode: and a second coupling element aligned with a second anti-node of the resonant mdoe.

2. A whispering gallery mode dielectric resonator as claimed in claim 1, wherein the selectively coupled electromagnetic energy comprises an evanescent field in a region between the dielectric element and the enclosure.

3. A whispering gallery mode dielectric resonator as claimed in claim 1, wherein the desired resonant mode has a spatial symmetry with a plurality of first anti-nodes and a plurality of second anti-nodes, having a phase of approximately 180° relative to a phase of the first anti-nodes, and the structure comprises: a plurality of coupling elements with one coupling element selectively aligned over each of the anti-nodes.

4. A whispering gallery mode dielectric resonator as claimed in claim 3, wherein each of the coupling elements aligned over the first anti-nodes are connected together and each of the coupling elements aligned over the second anti-nodes are coupled together.

5. A whispering gallery mode dielectric resonator as claimed in claim 3, wherein each of the coupling elements comprises: a transmission line connected to a conductive loop disposed over the respective first anti-node or second anti-node and oriented so that a magnetic field of the desired mode induces a current in the loop.

6. A whispering gallery mode dielectric resonator as claimed in claim 5, wherein each of the transmission lines connected to loops disposed over one of the first anti-nodes are connected electrically in parallel; and each of the transmission lines connected to loops disposed over one of the second anti-nodes are connected electrically in parallel.

7. A whispering gallery mode dielectric resonator as claimed in claim 1, wherein the dielectric element is a ring dielectric element.

8. A whispering gallery mode dielectric resonator as claimed in claim 1, wherein the enclosure is cylindrically shaped and the structure is disposed over the top.

9. A whispering gallery mode dielectric resonator as claimed in claim 1, wherein the enclosure is cylindrically shaped and the structure is disposed over the bottom.

10. An electrical oscillator circuit, comprising:
    a whispering gallery mode dielectric resonator, comprising:
    a conductive enclosure comprising a top, a bottom and walls; a dielectric element disposed in the enclosure and operative to support a desired resonant mode that is dependent on a shape and dimensions of the dielectric resonator; and a structure disposed over the enclosure and configured to selectively couple electromagnetic energy of the desired mode and configured not to substantially couple electromagnetic energy of a spurious mode supported in a region between the enclosure and the dielectric element;
    a bandpass filter operative to filter spurious modes from the whispering gallery mode dielectric resonator wherein the structure comprises: a first coupling element aligned with a first anti-node of the resonant mode: and a second coupling element aligned with a second anti-node of the resonant mode; and
    an amplifier connected to the filter.

11. An electrical oscillator circuit as claimed in claim 10, wherein the selectively coupled electromagnetic energy comprises and evanescent field away in a region between the dielectric element and the enclosure.

12. An electrical oscillator circuit as claimed in claim 10, wherein the desired resonant mode has a spatial symmetry with a plurality of first anti-nodes and a plurality of second anti-nodes, having a phase of approximately 180° relative to a phase of the first anti-nodes, and the structure comprises: a plurality of coupling elements with one coupling element selectively aligned over each of the anti-nodes.

13. An electrical oscillator circuit as claimed in claim 12, wherein each of the coupling elements aligned over the first anti-nodes are connected together and each of the coupling elements aligned over the second anti-nodes are coupled together.

14. An electrical oscillator circuit as claimed in claim 12, wherein each of the coupling elements comprises: a transmission line connected to a conductive loop disposed over the respective first anti-node or second anti-node and oriented so that a magnetic field of the desired mode induces a current in the loop.

15. An electrical oscillator circuit as claimed in claim 14, wherein each of the transmission lines connected to loops disposed over one of the first anti-nodes are connected electrically in parallel; and each of the transmission lines connected to loops disposed over one of the second anti-nodes are connected electrically in parallel.

16. An electrical oscillator circuit whispering gallery mode dielectric resonator as claimed in claim 10, wherein the dielectric element is a ring dielectric element.

17. An electrical oscillator circuit as claimed in claim 10, wherein the enclosure is cylindrically shaped and the structure is disposed over the top.

18. An electrical oscillator circuit as claimed in claim 10, wherein the enclosure is cylindrically shaped and the structure is disposed over the bottom.

* * * * *